US007608823B2

(12) United States Patent
Tennant

(10) Patent No.: US 7,608,823 B2
(45) Date of Patent: Oct. 27, 2009

(54) MULTIMODE FOCAL PLANE ARRAY WITH ELECTRICALLY ISOLATED COMMONS FOR INDEPENDENT SUB-ARRAY BIASING

(75) Inventor: William E. Tennant, Thousand Oaks, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 169 days.

(21) Appl. No.: 11/163,022

(22) Filed: Oct. 3, 2005

(65) Prior Publication Data

US 2007/0076481 A1    Apr. 5, 2007

(51) Int. Cl.
*G01J 5/02* (2006.01)
(52) U.S. Cl. ............. 250/338.1; 250/208.1; 250/339.01
(58) Field of Classification Search ........................ None
See application file for complete search history.

(56) References Cited

U.S. PATENT DOCUMENTS

| | | | | |
|---|---|---|---|---|
| 5,149,956 A | * | 9/1992 | Norton | 257/188 |
| 5,559,336 A | * | 9/1996 | Kosai et al. | 257/188 |
| 5,600,486 A | | 2/1997 | Gal et al. | 359/569 |
| 5,671,914 A | * | 9/1997 | Kalkhoran et al. | 257/77 |
| 6,034,407 A | | 3/2000 | Tennant et al. | 257/440 |
| 6,407,439 B1 | * | 6/2002 | Hier et al. | 257/440 |
| 6,465,860 B2 | * | 10/2002 | Shigenaka et al. | 257/442 |
| 2005/0167709 A1 | * | 8/2005 | Augusto | 257/292 |
| 2005/0253132 A1 | * | 11/2005 | Marshall et al. | 257/24 |

OTHER PUBLICATIONS

Bounds, Jeffrey, "The Infrared Airborne Radar Sensor Suite", The Research Laboratory of Electronics at MIT: RLE Technical Report 610, Dec. 1996; pp. 1-2.*
Deiters, K, et al. "Properties of the available photodiodes for the CMS electromagnetic calorimeter", Nuclear Instruments and Methods in Physics Research Section A: Accelerators, Spectrometers, Detectors, and Associated Equipment, vol. 453, Issues 1-2, Oct. 11, 2000; pp. 223-226.*
Skrimshire, et al. "Reliability of mesa and planar InGaAs PIN photodiodes", IEEE proceedings, vol. 137, PT J, No. 1, Feb. 1990; pp. 74-78.*
"Sensors: APD Photodiodes", Perkin Elmer Precisely [online], copyright 2004. Retrieved from the Internet:<URL: http://optoelectronics.perkinelmer.com/FAQs/FAWdisplaytable.aspx?Fawld=72>.*

* cited by examiner

*Primary Examiner*—David P Porta
*Assistant Examiner*—Yara B Green
(74) *Attorney, Agent, or Firm*—Koppel, Patrick, Heybl & Dawson

(57) ABSTRACT

In a multimode FPA, all of the FPA's conducting layers including all of the absorbing layers are patterned to form electrically isolated commons for at least two, and in some instances all of the photodetector sub-arrays, to support independent mode biasing of the photodetectors. Because the commons are electrically isolated, the bias voltages are not constrained by the CMOS design rules. The commons can accommodate large bias amplitude differences and different temporal bias profiles to address a wide range of multimode sensing applications.

24 Claims, 11 Drawing Sheets

MULTIMODE FOCAL PLANE ARRAY WITH ELECTRICALLY ISOLATED COMMONS FOR INDEPENDENT SUB-ARRAY BIASING

FIELD OF THE INVENTION

This invention relates to multimode focal plane arrays (FPAs) formed with CMOS and semiconductor photodetector technologies and more specifically to a multimode FPA architecture with electrically isolated commons for independent sub-array biasing to accommodate large bias amplitude differences and different temporal bias profiles.

DESCRIPTION OF THE RELATED ART

A typical focal plane array (FPA) fabricated using CMOS and semiconductor photodetector technologies includes a layer of semiconductor material, suitably HgCdTe, that absorbs radiation over a broad spectral band such as infrared (IR), in the process generating electrical carriers (electrons or holes) within the material. The layer is selectively doped to form an array of photodetectors. A bias voltage is applied to the layer via a shared common so that the photodetectors can transfer the electrical carriers generated by the incident photons into a pixilated image pattern of electrical currents. A read out integrated circuit (ROIC), consisting of control and readout circuitry and an array of input cells each attached electrically to an element of the array of photodetectors, integrates the currents generated by each photodetector over an integration period and reads out their magnitude as a stream of currents, voltages, or digital bits. The FPA may detect photons over a very broad band, say 0.4-14 microns, or over dedicated bands say 0.4-0.7 microns in a visible band, 0.9-2.0 microns in a near infrared (NIR) band, 2.0-3.0 in a short wave infrared (SWIR) band, 3-6 microns in a medium wave IR (MWIR) band, 8-14 microns in a long wave IR (LWIR) band, 14-22 microns in a very long IR (VLWIR) band, 0.1 mm -1 mm in a microwave band, or even 1.55±0.01 µm in a very narrow band such as might be used by a laser. FPAs and their ROICs are well known in the relevant art and are used in many applications including astronomy, industrial process monitoring and analysis, medical diagnostics, and multiple military applications. In certain applications it may be desirable to simultaneously detect incident IR radiation in multiple bands and produce a registered multimode image of the radiation.

U.S. Pat. No. 6,034,407 describes a structure for multi-spectral planar photodiode infrared radiation detector picture elements (pixels) for simultaneously detecting multi-colors of infrared radiation. First and second color layers 27 and 31 are engineered to absorb medium wavelength infrared radiation (MWIR) and long wavelength infrared radiation (LWIR), respectively. First and second color diodes 41 and 43 are induced into the first and second color layers. A ground strip 82 on the buffer layer 25 carries the bias voltage for both the first and second color diodes. Incident MWIR radiation is absorbed within the first color layer generating electron-hole pairs. The electrons are laterally collected by the first color diode. Similarly, LWIR radiation is detected by the second color diode.

U.S. Pat. No. 5,600,486 describes a color separation microlens that is fabricated to be a single micro-optical element made up of a color separation grating integrated with a refractive lens. The microlens separates the spectrum into distinct color spots and focuses these spots to a common plane. The spots fall at the locations of the different diffraction orders of the grating for each color, with other grating properties (such as blaze angle) helping to determine the distribution of intensity among the diffracted orders. The color separation is thus done by the grating, and the focusing is done by the lens. This lens has been used in combination with a standard single-color FPA to create a multi-spectral FPA. Wavelength selection is performed optically rather than by the absorption properties of the layers.

Although adequate for certain multi-spectral applications, neither approach is suitable for typical "Active-Passive" sensing applications. An "Active" signal is radiation such as visible or NIR that is generated by a source such as a laser and reflected off of an object to the FPA. Due to the long distances from the source to the object and back to the detector, such active radiation is typically very dim (often only a few photons per sensing period per pixel) and often requires a very sensitive detector such as an avalanche photodiode or APD which has built-in gain that multiplies the photogenerated charge. Such detectors are also needed for certain "passive" applications such as detection in overcast starlight where the photons reflected from the scene objects are few. Moreover, some "active" signals are generated by pulsed or time-varying lasers and require both high gain and temporally varying detector bias. A more conventional "Passive" signal is thermal radiation emitted from the scene objects. Passive radiation is typically detected by conventional photodiodes (PDs) usually of the "PIN" variety. These devices have gains of unity or less.

Neither the standard single-color FPA or the multi-spectral FPA support the integration of both PIN diodes/photodiodes and APDs. The design rules for current CMOS processing limit the variation in bias voltages from the common FPA bias to 2-5 volts. Now, the PIN diodes/photodiodes require 0-0.5V bias to obtain good optical collection whereas the APDs require 6-100V for avalanche gain. Clearly, these bias voltages are not supported within the ranges of current CMOS design rules. Furthermore, as the need increases for lower power CMOS-based electronics, the oxide layers in the FPA will become thinner and this available CMOS voltage range will be further reduced.

To work around the limitation of the CMOS design rules, "Active-Passive" IR detection systems employ a color cube to split the incident radiation into the desired colors, a pair of independent optical systems and FPAs to detect and form an image for each color and electronics, combined with careful optical system construction, to register the two images. This system is large, heavy, expensive, and provides relatively poor registration.

Furthermore, in a standard ROIC for use with a single or multi-mode FPA, different groups of input cells may be addressed at different times e.g. time-domain multiplexing, allowing the detectors in the FPA attached to these input cells to have different temporal bias profiles. This is well within CMOS design rules. If the voltage swings are extreme, however, the temporal swings may produce changes in neighboring pixels through stray capacitance or through spreading resistance flows that could change biases on neighboring detectors and produce cross-talk.

There remains a general need for an integrated multimode FPA that can sense multiple signals and produce a registered multimode image, and more specifically for an FPA that can detect active and passive sources simultaneously.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a multimode IR FPA with independent mode biasing. This is accomplished with an FPA that includes a multimode detector array having at least two sub-arrays of photodetectors for detecting incident radiation in different modes with elements of at least two sub-arrays co-located in each of at least one image pixel to provide registration among images from the different modes. The sub-arrays are configured with electrically isolated commons to support independent mode biasing. Different modes can be determined by the source e.g. wavelength, intensity or temporal profile and/or the photodetector e.g., detector types, gain or temporal bias profile.

All of the detector array's conducting layers, including all of the absorbing layers, are patterned to form the electrically isolated commons for at least two, and in some instances all of the sub-arrays. Because the commons are electrically isolated, the application of substantially different bias voltages, in amplitude and/or temporal profile, does not produce crosstalk between the sub-arrays. The signal-to-noise ratio (SNR) is the most important figure of merit of a detector. Because of the isolated commons, the SNR of detectors in one sub-array is independent of the bias applied to another sub-array. Independent biasability allows the detector array to include APDs, PDs, PINs, photo capacitors, photo conductors or any combination thereof among the different sub-arrays to support different methods of detection including the "Active-Passive" case and improved sensitivity to incident radiation.

In an embodiment, the detector array is attached to a readout integrated circuit (ROIC) which has been modified to include for each sub-array a separate contact pad and electrical connection insulated from all other circuits to permit application of a bias voltage directly from a supply external to the FPA.

In another embodiment, the difference in bias voltages applied to at least two of the electrically isolated sub-arrays exceeds the maximum variation in bias voltage that would be supported by standard CMOS technology using a single common for the sub-arrays.

In another embodiment, the temporal profile of the applied bias for one sub-array is different than that of another sub-array.

In another embodiment, at least one array includes APDs and another array includes PDs. The APD array being biased to provide avalanche gain (>2) and the PD array being biased to obtain good optical collection (gain $\leq 1$).

In another embodiment, in which the modes are determined, at least in part, by wavelength, external optics collect the incident radiation and focus it at an image plane above the FPA. Pixelated internal optics at this image plane separates the incident radiation within each pixel into different wavelengths and focuses the different wavelengths onto the appropriate photodetector sub-pixels in the respective sub-arrays. Each pixel of the internal optics typically uses a diffraction grating to separate the wavelengths and a refractive lens to focus them onto the photodetectors. The diffraction grating and refractive lens are suitably integrated into a unitary microlens. The use of such internal optics improves fill-factor by directing a larger portion of the incident radiation to the appropriate detectors and makes possible the use of single-layer FPAs by performing the wavelength selection optically.

These and other features and advantages of the invention will be apparent to those skilled in the art from the following detailed description of preferred embodiments, taken together with the accompanying drawings, in which:

DETAILED DESCRIPTION OF THE INVENTION

The present invention provides an FPA that includes at least two sub-arrays of photodetectors for detecting incident radiation at different modes with elements of at least two sub-arrays co-located in each of at least one image pixel to provide registration among images from the different modes. The sub-arrays are configured with electrically isolated commons to support independent mode biasing.

The FPA may be configured to detect incident radiation over a broad spectrum including IR, visible, UV and possibly millimeter wave. The FPA can be constructed from any alloy semiconductor system with different band gaps, including the entire range of II-VI pseudobinary alloys (e.g. [Zn, Mn, Cd, Hg][S, Se, Te]), III-V pseudobinary alloys ([B, Al, Ga, In][N, P, As, Si, Bi]), and IV-VI "lead salt" compounds ([Sn, Pb][S, Se, Te]). In addition, separate layers might be attached to one another by gluing and thinning while maintaining isolation between regions of common material used in different modes. The FPA may include APDs, PDs, PIN diodes, photo capacitors, photo conductors or any combination thereof Different modes can be determined by the source e.g. wavelength, intensity or temporal profile and/or the photodetector e.g., detector type or operation including gain or temporal bias profile. For example, the FPA may detect signal intensity in two different wavelength bands, e.g. 3-5 μm and 1.55±0.01 μm, intensity levels, e.g. 1E6 photons/pixel/frame emitted from a scene and 10 photons/pixel/frame reflected from the scene, or temporal profile, e.g. constant and pulsed. Alternately, the FPA may detect signal intensity with photodetectors including APD and PIN diodes, low and high gain, or constant and pulsed bias voltages.

By way of example and without loss of generality, the invention will be described with reference to the figures for a FPA configured to detect IR radiation using HgCdTe materials for an "Active-Passive" application in which the modes are defined by the different wavelengths and intensity levels of the active and passive sources and the type of photodetectors (APDs and PIN diodes) and gain levels. "Wavelength" as used herein signifies a band of wavelengths around, for example, a first or second wavelength. The band may be narrow in the case of active sources or wide in the case of passive sources. Wavelength is essentially the same as the terms "band" or "color" used in the relevant literature. In some cases microlenses are used to provide local separation of light with different mode properties to enable or improve detection of the information contained in the different modes. Also illustrated is the case in which the source radiation has varying temporal profiles whereby the detectors in one sub-array are activated for only a brief time during a frame while the detectors in the other sub-array are continuously active during the frame.

Figure 1:
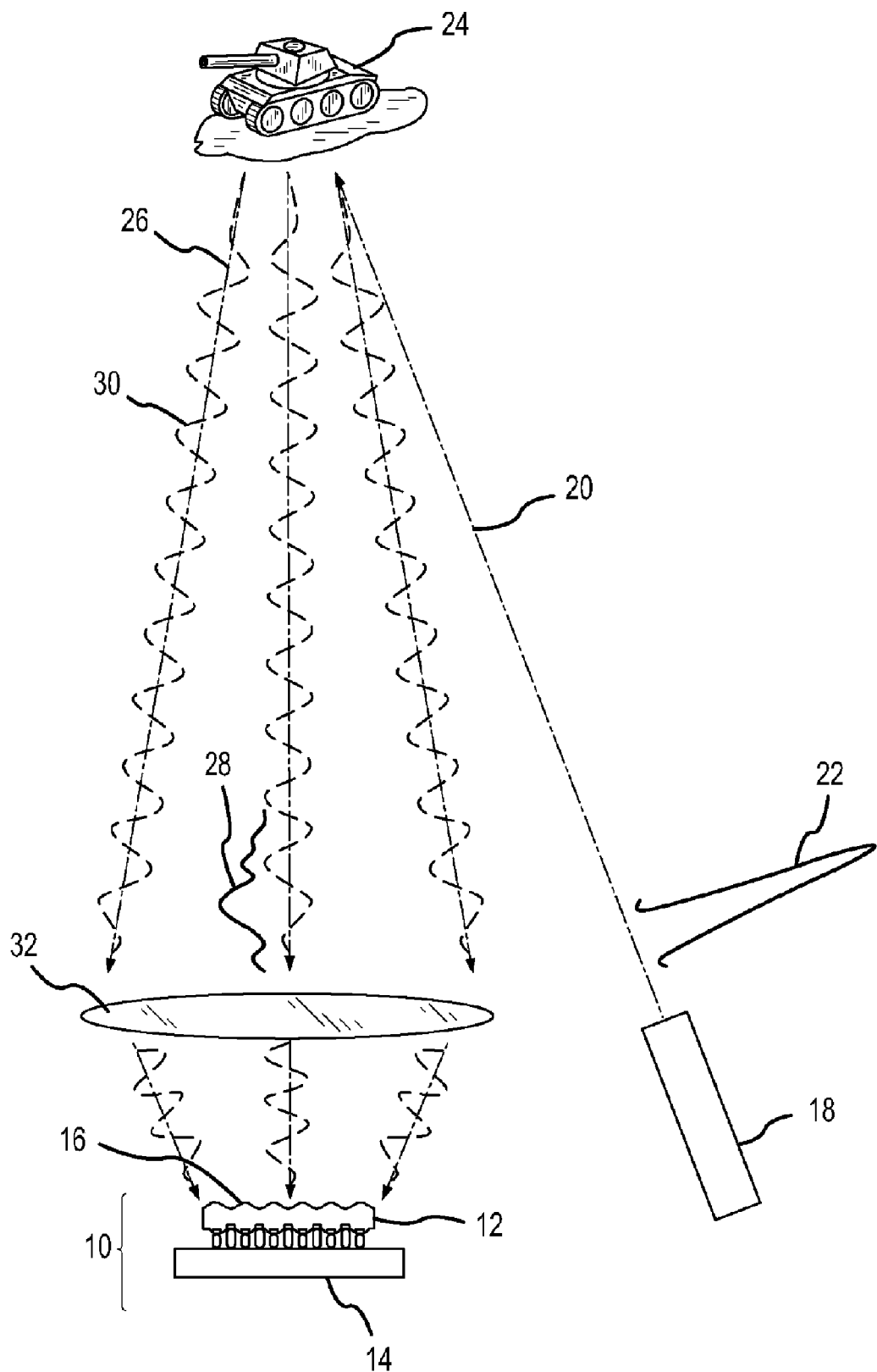
FIG. 1 is a diagram of an IR multimode imaging system.

As shown in FIG. 1, a multimode FPA 10 includes a multimode detector array 12 having multiple sub-arrays of spatially co-located photodetectors with at least two of the sub-arrays having electrically isolated commons for providing independent mode biasing to detect multimode radiation and form a registered multimode image. The FPA is suitably mounted on a ROIC 14 that is modified to include an insulated contact structure to permit application of different bias voltages to the different commons and to read out the multimode signal image. The integration of a microlens 16 on the backside of the FPA separates the image according to wavelength (where wavelength is one of the mode characteristics) and focuses the different wavelength radiation onto the appropriate sub-arrays of photodetectors. The microlens is optional but does improve collection efficiency and SNR.

As will be discussed in detailed below, all of the FPA's conducting layers including all of the absorbing layers are patterned to form electrically isolated commons for at least two, and in some instances all of the photodetector sub-arrays, to support independent mode biasing of the photodetectors. Because the commons are electrically isolated, the bias voltages are not constrained by the CMOS design rules and different types of detectors including APDs, PDs, PIN diodes, photo capacitors, photo conductors or any combination thereof, which require a wide range of bias voltages, e.g. 0-100V to achieve the appropriate gain, can be integrated on the FPA to address a wide range of sensing applications. Furthermore, the isolated commons overcome the limitations of applying different temporal biases to different groups of detectors. First, the voltage swing is no longer constrained by CMOS design rules. Second, if the incident radiation can be otherwise separated e.g. by wavelength or signal intensity, the different temporal biases can be applied simultaneously to the different groups thereby eliminating the time domain multiplexing requirement.

In the sensing application depicted in FIG. 1, the FPA 12 is configured with APDs in a first sub-array to detect an active signal at a first wavelength e.g. 1.55±0.01 μm and PIN diodes (or photodiodes) in a second sub-array to detect a passive signal at a second wavelength e.g. 3-5 μm within the IR spectrum. The APDs typically require a bias of 10-100V to achieve avalanche gain (>2), while PIN diodes typically require a bias of 0-0.5V to achieve sufficient gain ($\leq$1) for good optical collection. As described above, the multimode structure is determined by the wavelength of the source radiation, the type of photodetector and the intensity of the signal/gain of the photodetector. Clearly, the required bias levels are well outside the CMOS design rules but are achievable by configuring the FPA ROIC so that the sub-arrays have electrically isolated commons, which are also electrically isolated from the standard CMOS circuitry on the ROIC.

A pulsed laser illuminator 18 emits a laser beam 20, suitably visible to LWIR, as a sequence of pulses 22 that are directed at an object 24 such as a tank. The object reflects the laser radiation as a return signature 26, including distorted pulses 28 that contain depth information of the object, and passively emits thermal radiation 30. The active and passive radiation are collected by sensor optics 32 and projected onto the FPA 12. The microlens 16 separates the active and passive wavelengths and directs them onto the APDs and PIN diodes, respectively, thereby improving collection efficiency and SNR. The ROIC 14 reads out the registered multimode signal pattern, where the signal from the PIN diodes gives intensity, while the signal from the APD gives time-of-flight and possibly intensity as well, depending on the particular circuits used.

Figure 2A:
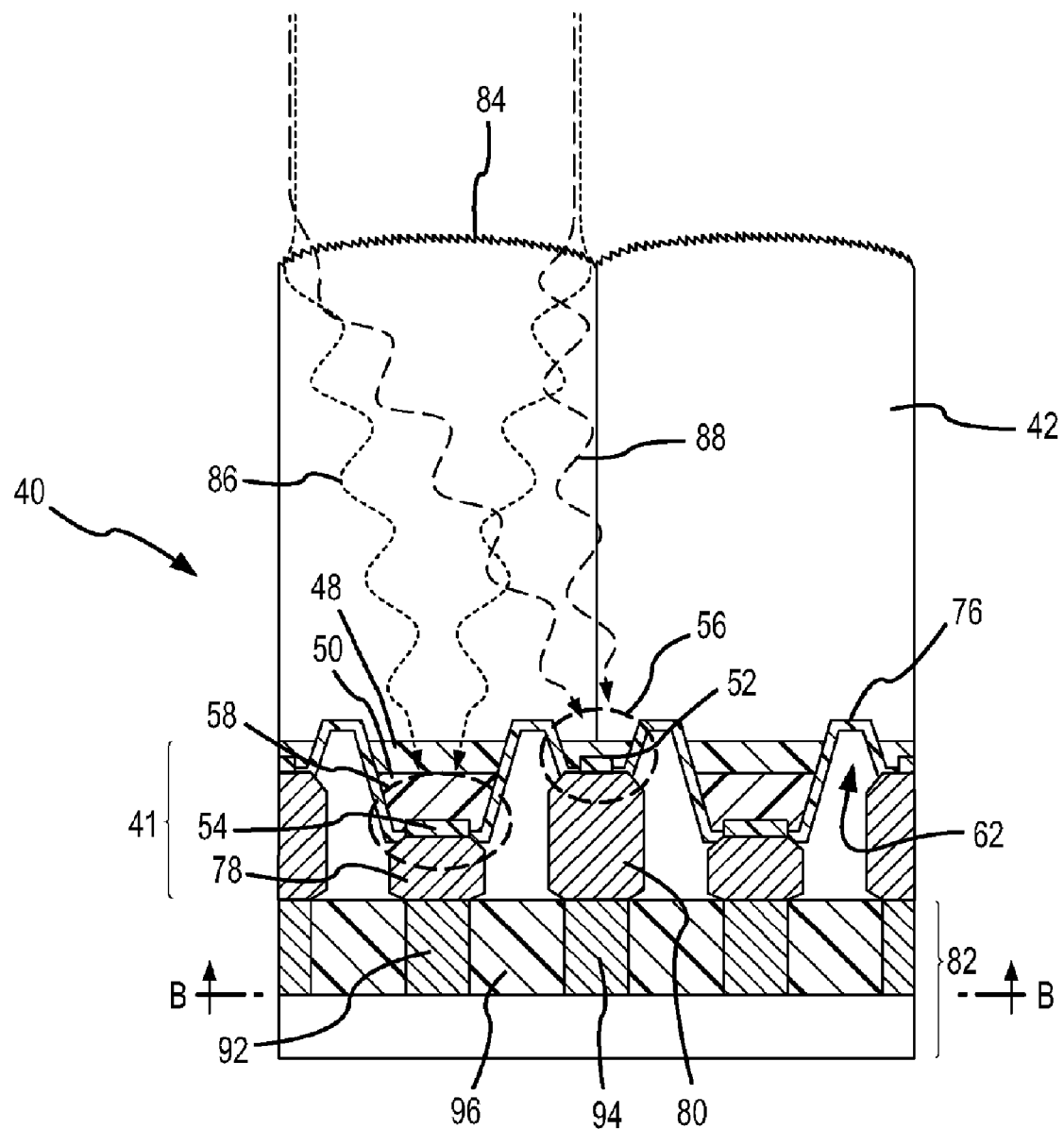
FIGS. 2a and 2b are a section and plan view along section line B-B of a multimode FPA having a pair of sub-arrays with electrically isolated commons and a microlens structure and a ROIC with an insulated contact structure in accordance with the present invention.
Figure 2B:
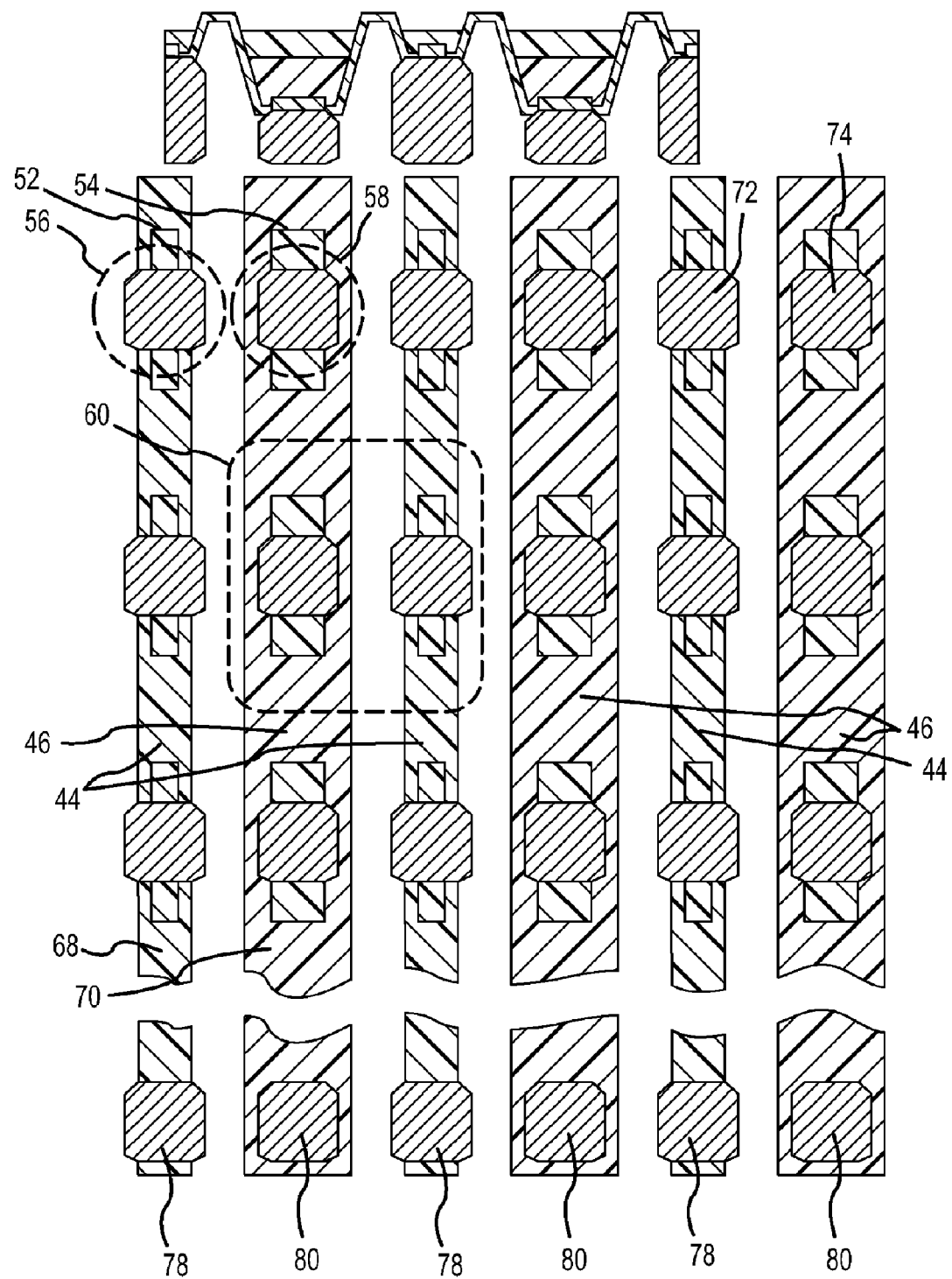

An exemplary embodiment of a dual-wavelength Active-Passive FPA 40 is shown in FIGS. 2 and 3. In this particular embodiment, two different layers are used to absorb the radiation at the two different wavelengths. Although this is preferred for sensitivity and SNR, multi-wavelength capability can be achieved in a single layer as will be described in reference to FIG. 6. Also, in this particular embodiment, active and passive photodetector sub-arrays are formed in alternating rows whereby each image pixel includes one element from each of the two sub-arrays. Although this may be a typical and useful configuration to generate registered multimode images, other configurations are also possible. Most generally, at least two sub-arrays having electrically isolated commons will have photodetectors that are co-located in at least one image pixel. For example, the FPA may be configured to have a small multimode region inside a larger single-mode region.

FPA 40 includes a multimode detector array 41 and a ROIC chip 82. Detector array 41 includes an insulating single-crystal IR-transparent insulating substrate 42 (for HgCdTe this is typically CdZnTe, but also silicon, GaAs, or other materials may be used), which allows for electrical isolation of the APD sub-array 44 from the PIN diode sub-array 46. The sub-arrays are formed in a multilayer film of IR absorbing material, suitably $Hg_{1-x}Cd_xTe$ where x is the fraction CdTe in this pseudobinary alloy system and determines the absorption properties by determining the band gap of the alloy. In this embodiment, the film includes a shorter wavelength absorber layer 48 for the shorter wavelength APD detector and a longer-wavelength absorber layer 50 for the longer wavelength PIN diode detector. For clarity, the buffer, barrier and cap layers need to actually grow this structure are omitted but are described below.

Figure 3A:
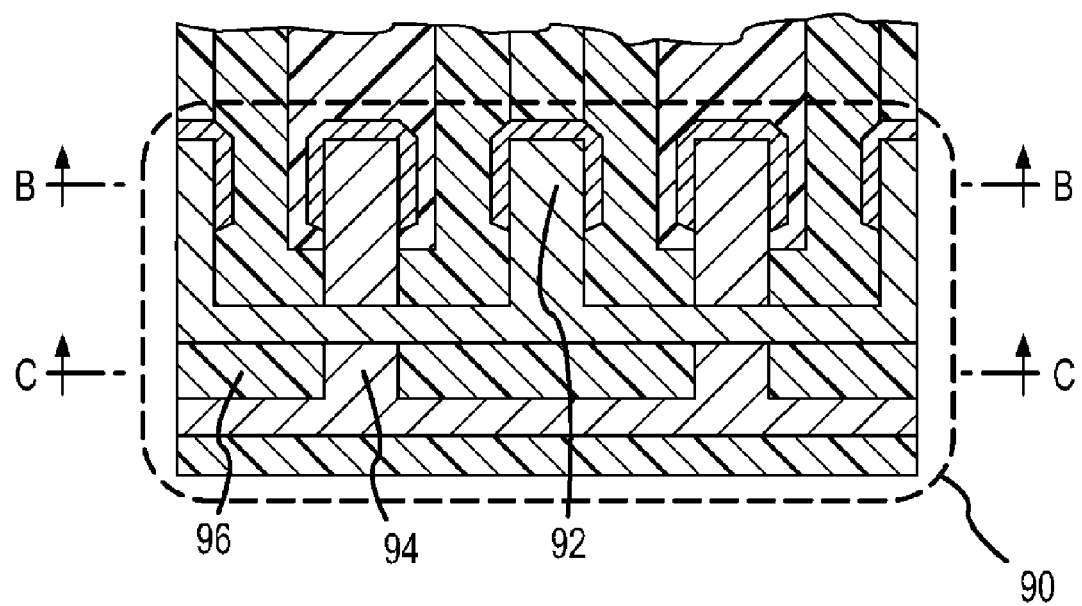
FIGS. 3a through 3c are a plan view from the surface of the ROIC up through the insulating layer separating the common contacts on the ROIC and section views along section lines B-B and C-C of the of the common structure of the multimode FPA.
Figure 3B:
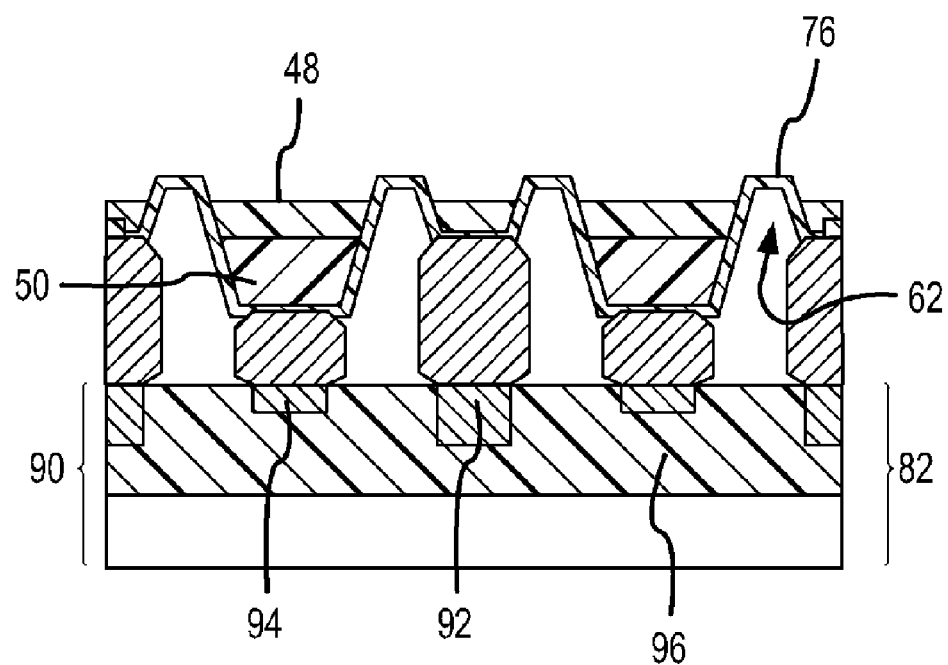
Figure 3C:
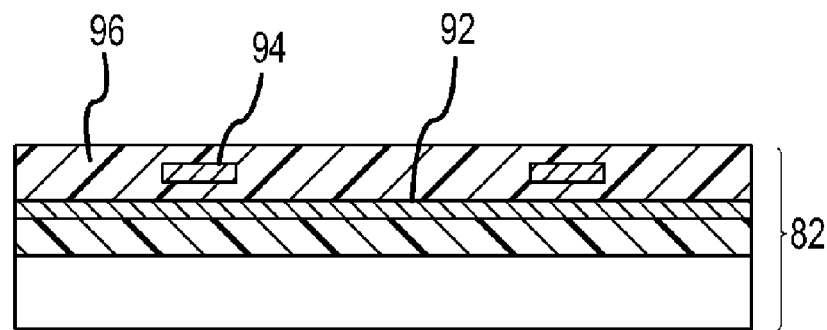

ROTC chip 82 includes an insulated contact structure 90 that permits connections through the chip to each sub-array but separated from the CMOS circuitry by an insulating layer 96 an thus not violating the design rules. This insulated contact structure thus provides the necessary bias voltages for the APD (10-100V) and the PIN diodes (0-0.5V typically). Because the large bias differences are applied to the commons, the ROIC input for each diode operates well within its CMOS design rules and reads out the multimode image signal pattern. The ROIC is typically standard in its input function, but modified by the addition either in the CMOS process (or afterward) to include a contact strip (92, 94) to each of the common contacts to the sub-arrays in the detector array. These contact strips, if added afterwards, are simply metal lines deposited over the covering oxide and (typically) away from the active CMOS circuitry. By deliberately violating some foundry design rules, these strips may be inserted in the ROIC process itself as illustrated in FIGS. 3a-3c (typically on one or more of the metal levels farthest from the silicon substrate), but still not adversely affect the ROIC performance or yield.

To isolate the sub-arrays and form the APDs and PIN diodes, a first set of grooves (modified by subsequent process steps) are formed in layer 50 to expose portions of layer 48. Doped regions 52 and 54 in the exposed portions of the first layer 48 and the remaining portion of the second layer 50, respectively, define the APDs 56 and PIN diodes 58 therein. In this particular embodiment, each image pixel 60 includes one APD 56 and one PIN diode 58.

A second set of grooves 62 through both layers and into the substrate 42 isolates the APD and PIN diode sub-arrays and defines electrically isolated commons in the first and second layers for the respective sub-arrays. The APD common is the strip 68 of material in layer 48 in which the APDs for that row of the sub-array are formed taken together with common contact pads 78 and common contact 92 in insulating layer 96 on ROIC 82. Similarly, the PIN diode common is the strip 70 of material in layer 50 in which the PIN diodes for that row of the sub-array are formed taken together with common contact pads 80 and common contact 94 in insulating layer 96 on ROIC 82.

Contact pads 72 and 74 for the APDs and PIN diodes are formed in holes in a passivation layer 76 to facilitate readout. Outside the image area, contact pads 78 and 80 for the APD and PIN diode commons are similarly formed to receive the bias voltages for the APD and PIN diode sub-arrays. Note in FIG. 3 that outside the residual (substrate 42) material between strips 68 and 70 is undoped providing the electrical insulation needed to isolate the sub-array commons. Because the multilayer metallization structure on the ROIC allows for any number of common contacts 92, 94, insulated by thick oxide 96 from each other and from the ROIC circuitry to be brought up, the number of sub-arrays can exceed the two shown. In the case of only two different sub-arrays, a common connection among sub arrays can be made in the plane of and from the conducting material of the finger itself at one or the other end of a finger, depending on which sub-array is being connected. This would be done by not removing the connecting material at one or the other ends of the fingers for each sub-array when forming the second set of grooves.

The completed diode structure is diced and hybridized to an appropriately designed readout integrated circuit (ROIC) 82 typically made in CMOS on silicon. The substrate 42 is thinned by polishing to a thickness corresponding to the focal length of the refractive microlenses, and refractive microlenses and a superposed diffraction grating (together microlens 84) are fabricated on the back of the thinned substrate. Light focused onto the plane of microlenses 84 (by the sensor optics) is concentrated into the APDs and PIN diodes. Longer wavelength light 86 (passive thermal emission) is not diffracted and is focused into the PIN Diode regions where it is collected in the longer wavelength absorber layer 50. Shorter wavelength light 88 is diffracted by the grating to separate it from the longer wavelength light and focused by the refractive microlenses into the APD regions where it is collected in the shorter wavelength layer 48.

In an alternate embodiment, the gap between the ROIC and the detector array is back-filled with epoxy, the substrate is removed and the thin layer of detector material that remains is passivated and coated. This allows the HgCdTe detectors to see visible light. Substrate removal preserves the electrical isolation, but would require a separate application of a dielectric spacing layer to position microlenses if microlenses were desired. A further refinement of this embodiment would be to remove the substrate first and then separate the sub-arrays by appropriate etching followed by passivation. This however would complicate processing and have value primarily if the structure on the diode side were so complex as to prohibit accurate etching.

To fabricate multimode detector array 41, molecular beam epitaxy (MBE) or other suitable growth technique (e.g. MOCVD) may be used to grow the tailored-composition multilayer $Hg_{1-x}Cd_xTe$ film on the single-crystal IR-transparent insulating substrate 42. For this device the initial layer is a wide-band-gap buffer layer (not shown) to prepare the substrate for absorber layer growth. The next growth is the shorter wave length absorber layer 48. A wide-band-gap barrier layer (not shown) is then grown to prevent minority carriers from diffusing from the shorter wavelength absorber layer into longer wavelength absorber layer. The longer-wavelength absorber layer 50 is grown. A wide band gap cap layer (not shown) is grown to facilitate high quality junction formation. All grown layers are doped with indium to insure n-type conductivity.

Following growth of the basic structure, grooves are etched to remove material down to (and into) the barrier layer where the shorter-wavelength APDs will be formed. At this point arsenic, ion-implanted through a photomask, forms regions 52, 54 which after an anneal, become the p/n photodiodes 56, 58. Prior to anneal a second groove etch 62, this time into the insulating substrate, separates the substrate commons 68, 70. The structure is annealed to activate the arsenic implant. Following junction anneal, the material is coated with a passivation (typically CdTe followed by an encapsulating overcoat). Contact holes etched through the passivation layer 76 followed by metal pad deposition 72,74,78,80 to include indium for interconnection to the readout circuit completes the process. Several variants in this process are possible depending on the particular diode architectures desired. Processes mentioned such as junction formation, metallization, and passivation vary among HgCdTe diode array manufacturers, but are widely known to those familiar with the art. Most or all of those process reported by various manufacturers could be used satisfactorily for this invention.

Figure 4:
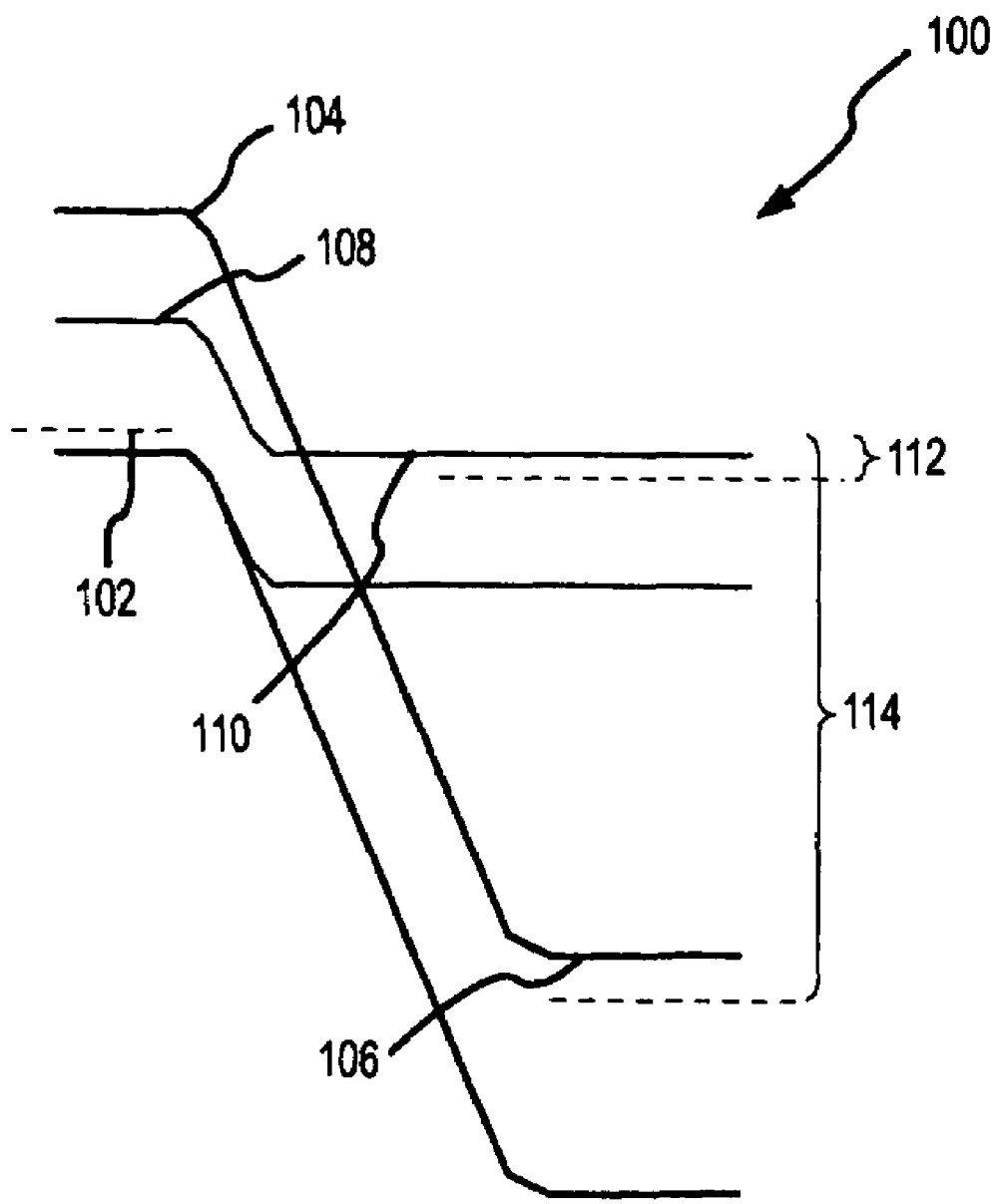
FIG. 4 is a bandgap diagram for an APD and PD illustrating disparate bias conditions not achievable with standard CMOS design rules with a shared common.

FIG. 4 is a band diagram 100 (superimposed) for both the shorter-wavelength APD detector and the longer-wavelength PIN diode detector. The vertical scale is relative electron energy (not to scale) and the horizontal axis is distance. The leftmost edge of the bands represents the surfaces of the devices where they attach through contacts to the ROIC input cells. A reference voltage 102 exists in the p-region and is typically held common to both the APD and PIN diode detectors, although some variation between sub arrays within the few volts allowed by CMOS design rules may be applied if needed for proper ROIC circuit operation. The conduction bands 104 and 106 in the p-side and n-side of the APD detector exhibit a wider band gap than the conduction bands 108 and 110 in the p-side and n-side of the PIN diode detector. The small drop in the band for the PIN diode indicates the small bias voltage 112, nominally 50-500 mV, needed for proper operation, i.e. gain sufficient for good optical collection ($\leq 1$). The large drop in the band for the APD indicates the much higher bias voltage 114, nominally 6-100V, possible (and needed) for proper operation, i.e. sufficient to achieve avalanche gain (>2). By forming electrically isolated commons in the FPA, the requisite bias voltages can be applied to achieve proper operation. Were the commons not separated, the right hand side of the diagram would have a common reference voltage and only the relatively small variations possible on the left hand side due to the ROIC would be allowed. This would severely limit the types of photodetectors that could be integrated in a multimode FPA.

Figure 5:
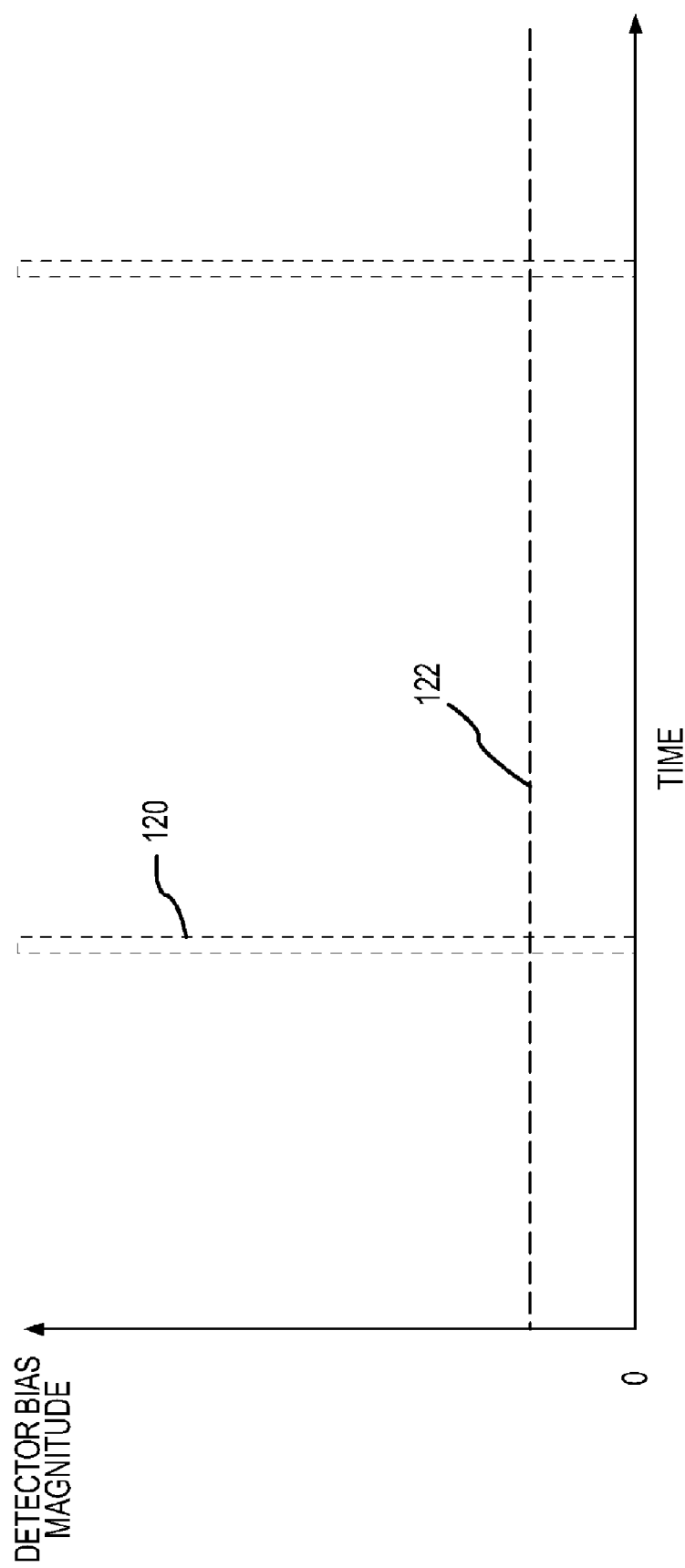
FIG. 5 is a plot of different temporal bias profiles not supported by standard CMOS processing.

By electrically isolating the commons, both the amplitude and temporal profile of the bias voltage for the APD sub-array are independent of those for the PIN diode sub-array. As a result, the FPA can tolerate large voltage swings applied to neighboring group of pixels and thus overcome the limitations of conventional time-domain multiplexing. Furthermore, if the source signals can be separated e.g. by wavelength and/or intensity, the different temporal biases can be applied to the respective sub-arrays concurrently In an exemplary embodiment as shown in FIG. 5, the FPA is configured and biased to detect a low intensity active signal and a high intensity passive signal. To do so, bias voltage 120 of the APD detector is pulsed at a desired rate to coincide with the anticipated return of a low-intensity active laser pulse. The other (passive) detector is held at a constant bias 122 and sampled without bias change through multiple frames. In the source and FPA configuration shown in FIGS. 1-3, pulsing the APD avoids excess dark current or other signals not of interest thereby improving SNR.

Alternately, if the source signals fell in the same wavelength band or the FPA was configured to detect radiation over a broad band including both wavelengths, the same pulsed and constant biasing scheme could be used. The high gain APD is pulsed for only a short time in sync with the laser frame rate and detects only relatively few photons at each window. The low gain PIN diode is biased to integrate for a frame time that is thousands of times longer than the short look for the pulse. Since distances of feet require only a few ns to resolve (round-trip time differences at the speed of light), the time for an open integrating window can be quite short, making the number of non-laser photons arriving during this time very small. Suppose one had a background charge of 1E6 photons in 16 ms frame time, but a laser return of only 100 photons sometime in a 100 ns window and were measuring the time to 1 ns. The APD with a gain of 1000 could produce a 1E5 electron signal in the 100 ns window which would include a negligible (1000×1E6×1E-8/1.6E-2 or 700 photons of) background contribution. Meanwhile the passive detector, integrating for the whole frame time but at a gain of ~1 would collect about 1E6 electrons.

Figure 6:
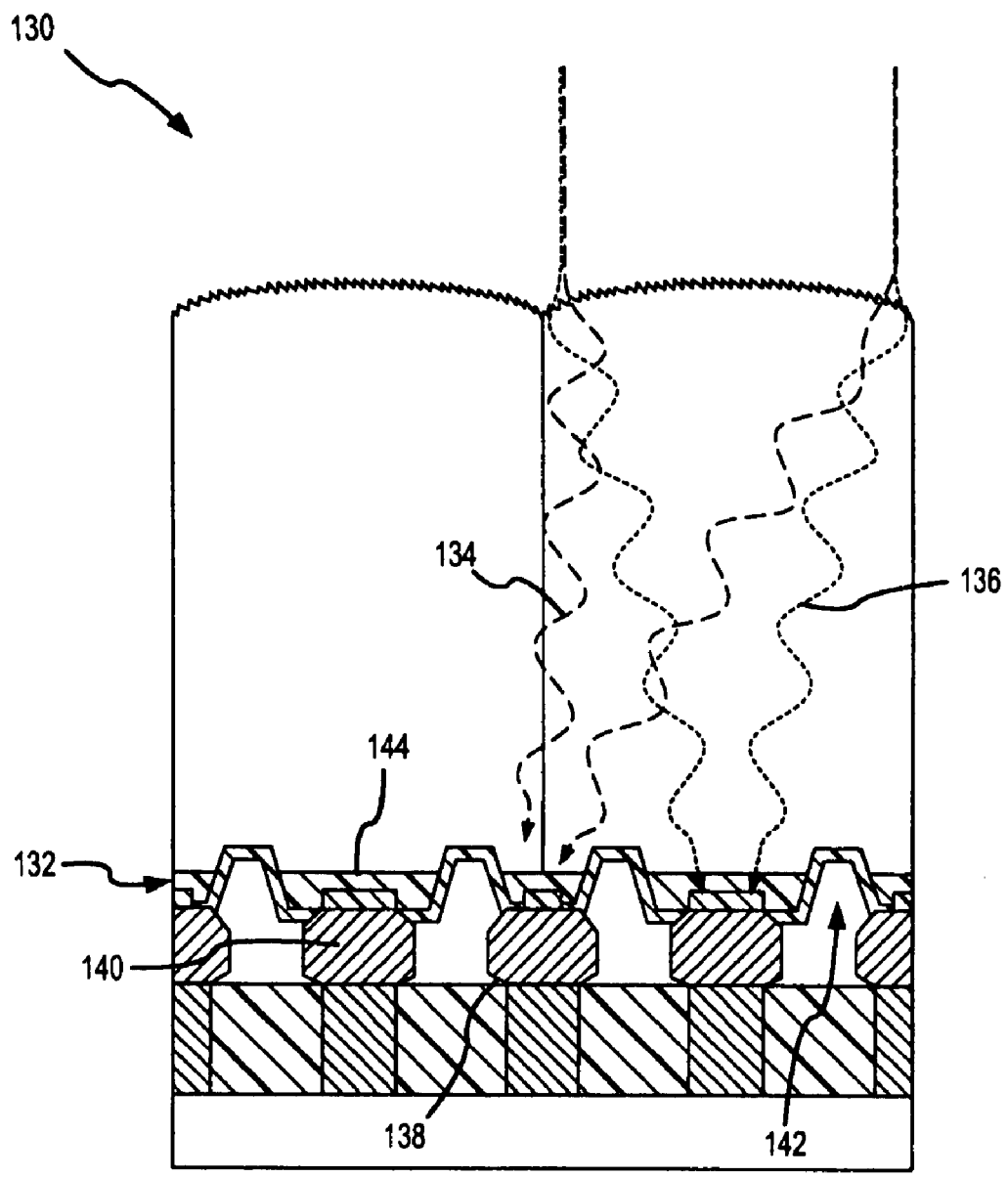
FIG. 6 is a section view of a single layer embodiment in which wavelength selection is performed optically.

As shown in FIG. 6, if the operating temperature and environment permit, an FPA 130 having a single layer 132 of IR absorbing material may be used to detect both active and passive signals 134, 136. The material has a sufficiently broad spectrum to detect both the active and passive wavelengths. In this configuration, wavelength selection is performed optically. The microlens separates the light and directs the active signal 134 to the APD 138 and the passive signal 136 to the PIN diode 140. The single layer 132 is etched just as before to form the grooves 142 that isolate the strips 144 of material that form the electrically isolated commons. The penalty paid is that a lower operating temperature must be used to bring the dark currents for the (now longer wavelength) APD down to an acceptable level. In an alternate embodiment, if the mode structure was determined by temporal profile and intensity of the source signals rather than wavelength, a single layer structure sans the microlens could be used to detect the different signals by independently controlling the bias voltages applied to the electrically isolated commons as described above in FIG. 5.

Figure 7:
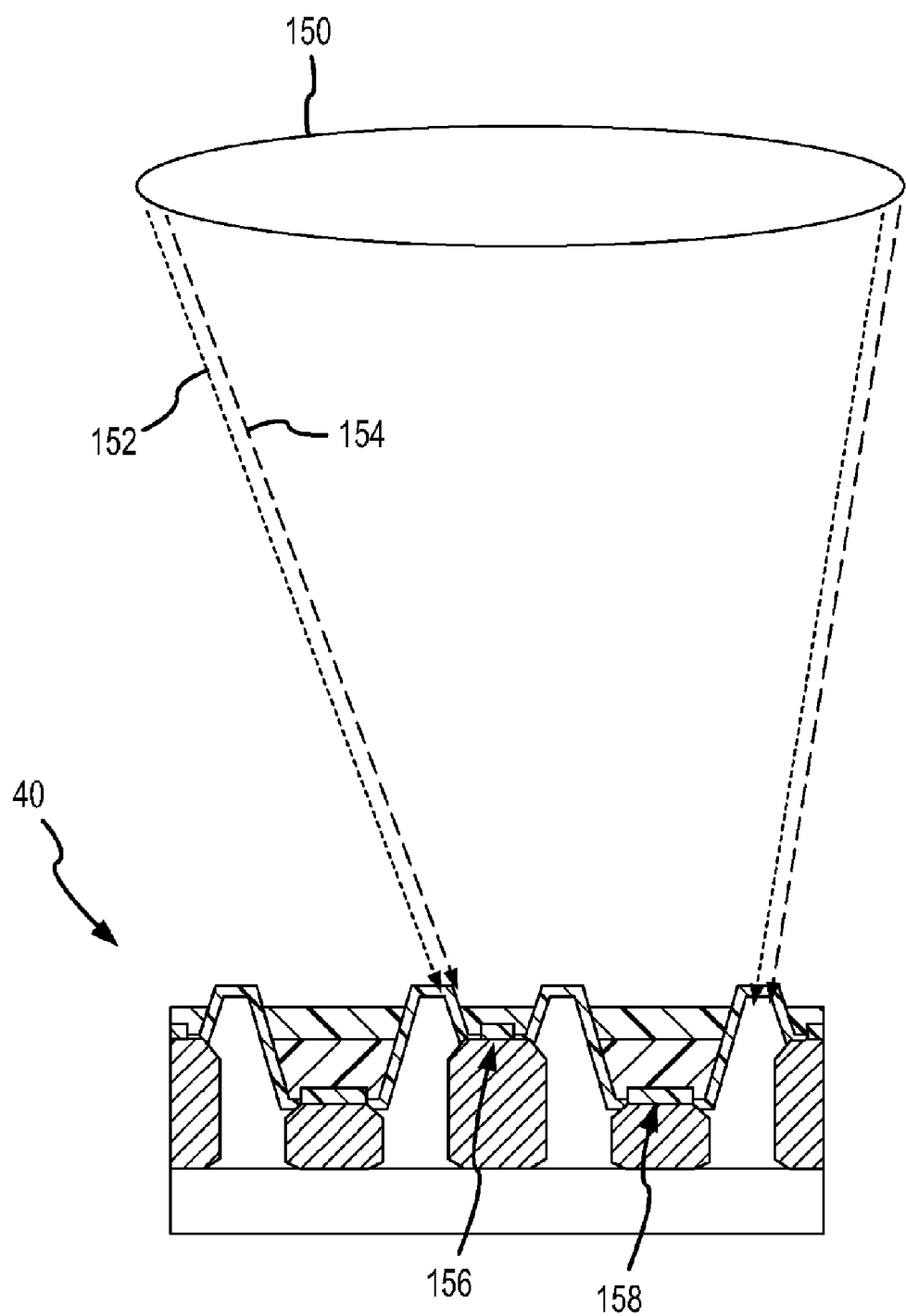
FIG. 7 is a section view of a multi-layer embodiment in which wavelength selection is performed by the materials.

As shown in FIG. 7, the FPA 40 described in FIG. 2 can be configured without microlenses 84. The electrically isolated commons still allow simultaneous active and passive detection, but now the fill factor (fraction of light collected by a diode within a pixel) is reduced to about 50%. Sensor optics 150 project light 152 from the passive scene emission and light 154 from the active scene illumination onto both the APD 156 and PIN diode 158. Consequently, roughly 50% of the light is incident on the wrong detector and thus is not collected.

Figure 8:
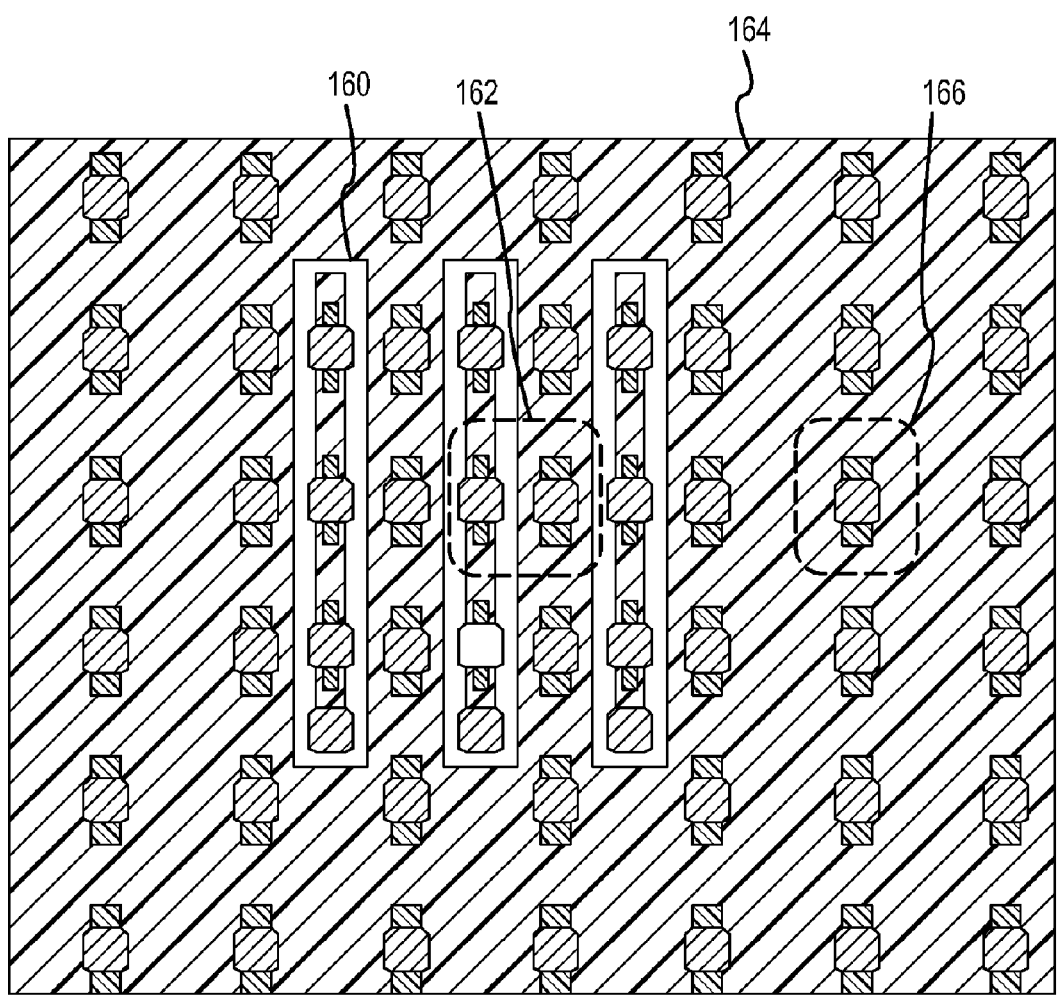
FIG. 8 is a plan view of a FPA in which a defined spatial region is multimode and the remaining region is single mode.

As shown in FIG. 8, by using electrically isolated commons locally it is possible to place a region 160 of active-passive pixels 162 in a larger array 164 of single-mode pixels 166 (here an array of passive pixels). This may be useful, for example, to allow range or shape information from a small actively illuminated region of a larger scene of passive information—essentially a three dimensional representation of some small but important region of the scene. Microlenses (not shown) need to be diffractive/refractive over the region of active-passive pixels to insure that the light is collected efficiently over the entire active-passive pixel 162. Other combinations and pixel configurations are also possible.

Figure 9:
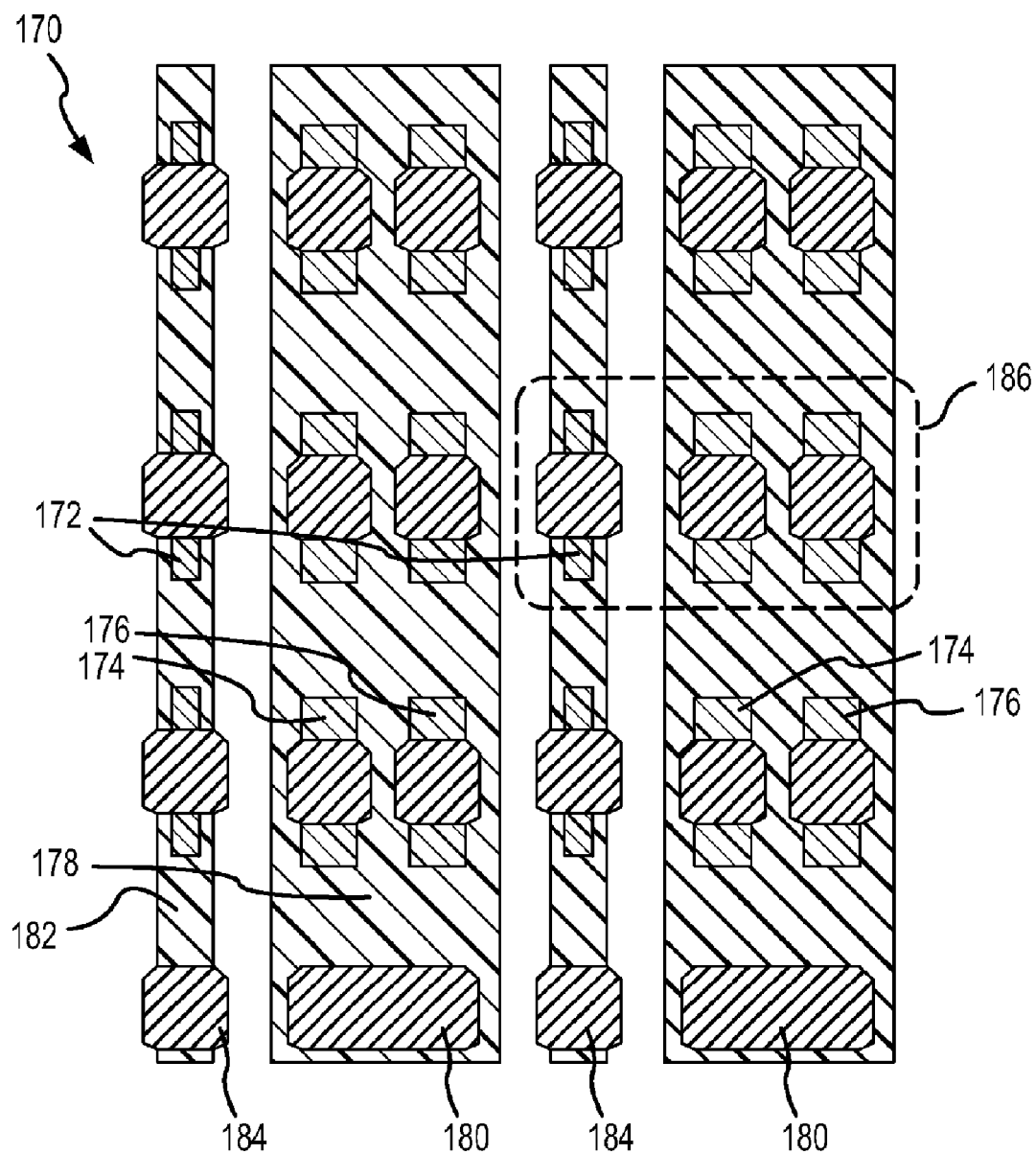
FIG. 9 is a plan view of a FPA architecture in which at least two arrays share a common and at least two arrays have electrically isolated commons.

As shown in FIG. 9, multiple sub-arrays may share an electrically isolated common. In this particular example, the FPA 170 includes three sub-arrays; an active sub-array 172 and two passive sub-arrays 174 and 176. Because the photodetectors in the passive sub-arrays have bias requirements that lie within the CMOS design rules they can share one electrically isolated common 178 that is connected to the ROIC via contact pad 180. The active sub-array has its own electrically isolated common 182 that is connected to the ROIC via contact pad 184. In this example, a pixel 186 includes one photodetector from each of the three sub-arrays.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

What is claimed is:

1. A multimode focal plane array (EPA), comprising a detector array with at least first and second sub-arrays of photodetectors having grooves in the detector array, at least some of said grooves arranged to define first and second electrically isolated commons, said first and second sub-arrays configured to detect incident radiation in different modes with photodetectors of said first and second sub-arrays co-located in at least one image pixel to produce a registered multimode image, wherein said photodetectors within said first sub-array share said first common and said photodetectors within said second sub-array share said second common, said first and second commons providing electrical isolation between said first and second sub-arrays.

2. The multimode EPA of claim 1, wherein said photodetectors are formed using semiconductor detector array technology and CMOS technology in accordance with CMOS design rules, further comprising a readout integrated circuit (ROIC) with an insulated contact structure that permits application of first and second bias voltages whose amplitudes differ by greater than that accommodated by the CMOS design rules to said first and second electrically isolated commons.

3. The multimode EPA of claim 2, wherein said first sub-array comprises avalanche photodiodes (APDs) adapted to receive said first bias voltage sufficient for avalanche gain greater than two and said second sub-array comprises PIN diodes adapted to receive said second bias voltage sufficient for optical collection gain less than or equal to one.

4. The multimode EPA of claim 1, further comprising a readout integrated circuit (ROTC) with an insulated contact structure that permits application of first and second bias voltages that differ temporally to the different commons.

5. The multimode FPA of claim 4, wherein said first bias voltage is held constant and said second bias voltage is pulsed at a predetermined rate.

6. The multimode FPA of claim 1, wherein photodetectors of said first and second sub-arrays are co-located in each image pixel of the registered multimode image.

7. The multimode FPA of claim 1, wherein photodetectors of said first and second sub-arrays are co-located in each image pixel within a first region of the image and only photodetectors of said first sub-array are located in each image pixel with a second region of the image.

8. The multimode FPA of claim 1, wherein the first and second sub-arrays are formed in a single layer of material covering a wavelength range common for both sub-arrays but for which detector architecture differs between the sub-arrays.

9. The multimode FPA of claim 8, further comprising:
doped regions in the single layer of material that define the photodetectors therein; and
wherein the grooves are disposed in the single layer through to a substrate that separate the first and second sub-arrays of the photodetectors and define the first and second electrically isolated commons in said layer.

10. The multimode FPA of claim 1, wherein the first and second arrays are formed in first and second layers of material that absorb radiation at different wavelengths.

11. The multimode FPA of claim 10, further comprising:
doped regions in the remaining portion of the second layer and the exposed portions of the first layer that define the photodetectors therein for said second and first sub-arrays, respectively; and
wherein the grooves comprise first grooves in the second layer that expose portions of the first layer and second grooves through said second and first layers to a substrate that separate the first and second sub-arrays and define the first and second electrically isolated commons in said first and second layers.

12. The multimode FPA of claim 1, further comprising micro-optics behind a substrate that separate incident radiation according to wavelength and direct the radiation to the photodetectors in appropriate sub-arrays.

13. The multimode FPA of claim 12, wherein the micro-optics includes a diffraction grating and a refractive lens.

14. The multimode FPA of claim 13, wherein the diffraction grating and refractive lens are integrated into a unitary microlens on the backside of the substrate.

15. A multimode focal plane array (FPA), comprising:
a multimode detector array comprising first and second sub-arrays of photodetectors that are co-located within image pixels to detect incident radiation in different modes, said first and second sub-arrays having grooves in the detector array, at least some of said grooves arranged to define first and second electrically isolated commons, said photodetectors in said first sub-array sharing said first common and said photodetectors in said second array sharing said second common; and
a readout integrated circuit (ROTC) with an insulated contact structure that permits application of first and second bias voltages to said first and second electrically isolated commons and reads out signals from the co-located photodetectors to produce a registered multimode image.

16. The multimode FPA of claim 15, wherein said photodetectors are formed using CMOS technology in accordance with CMOS design rules, said ROTC's insulated contact structure permitting application of said first and second bias voltages whose amplitudes differ by greater than that accommodated by the CMOS design rules.

17. The multimode FPA of claim 15, wherein the first and second sub-arrays are arranged in alternating rows with each image pixel comprising one photodetector from the first and second sub-arrays.

18. A multimode active-passive detection system, comprising:
a focal plane array (FPA) comprising first and second sub-arrays of photodetectors that are co-located within image pixels and absorb IR radiation at first and second wavelengths, respectively, said first and second sub-arrays having grooves in the FPA, at least some of said grooves arranged to define first and second electrically isolated commons, said first sub-array of photodetectors sharing said first common and said second sub-array of photodetectors sharing said second common;
a source for illuminating an object with an IR signal at said first wavelength;
an external lens behind the FPA that focuses active IR radiation at the first wavelength reflected off of the object and passive IR radiation emitted from the object at a second wavelength onto the FPA;
a microlens that separates the radiation into the first and second wavelengths and directs the radiation to the photodetectors in the first and second sub-arrays; and
a readout integrated circuit (ROTC) that permits application of first and second bias voltages to said first and second electrically isolated commons and reads out IR levels from the co-located photodetectors to produce a registered multimode image of both active and passive IR radiation from the object.

19. The multimode FPA of claim 18, wherein the photodetectors in said first and second sub-arrays are APDs and PIN diodes, respectively.

20. The multimode FPA of claim 19, wherein said first bias voltage is pulsed at a predetermined rate and said second bias voltage is held approximately constant.

21. A multimode focal plane array (FPA), comprising:
an insulating substrate;
an absorbing layer stack including at least one layer of material that absorbs radiation;
doped regions in exposed portions of the at least one layer that define photodetectors therein for first and second sub-arrays co-located in each of at least one image pixel; and
grooves through said stack to the substrate that separate the first and second sub-arrays and define first and second electrically isolated commons in said stack for the respective sub-arrays, said first sub-array of photodetectors sharing said first common and said second sub-array of photodetectors sharing said second common.

22. The multimode FPA of claim 21, wherein the stack includes only one layer.

23. The multimode FPA of claim 21, wherein the stack includes:
a first layer of material that absorbs radiation at a first wavelength;
a second layer of material that absorbs radiation at a second wavelength;
first grooves in the second layer that expose portions of the first layer; and
doped regions in the exposed portions of the first layer and the remaining portion of the second layer that define the photodetectors therein for first and second sub-arrays.

24. A multimode focal plane array (FPA), comprising:
a multimode detector array including, an absorbing layer stack including at least one layer of material that absorbs radiation;

doped regions in exposed portions of the at least one layer that define photodetectors therein for first and second sub-arrays co-located in each of at least one image pixel;

grooves through said stack that separate the first and second sub-arrays and define first and second electrically isolated commons in said stack for the respective sub-arrays, said first sub-array of photodetectors sharing said first common and said second sub-array of photodetectors sharing said second common; and a readout integrated circuit (ROTC) on the detector array, said ROTC including an insulated contact structure that permits application of first and second bias voltages to said first and second electrically isolated commons and reads out signals from the co-located photodetectors to produce a registered multimode image.

* * * * *

UNITED STATES PATENT AND TRADEMARK OFFICE
CERTIFICATE OF CORRECTION

PATENT NO. : 7,608,823 B2
APPLICATION NO. : 11/163022
DATED : October 27, 2009
INVENTOR(S) : William E. Tennant It is certified that error appears in the above-identified patent and that said Letters Patent is hereby corrected as shown below:

- Column 10, Claim 1, Line 36, A multimode focal plane array (EPA), comprising a
  It should read as: 1. A multimode focal plane array (FPA), comprising a

- Column 10, Claim 2, Line 49, The multimode EPA of claim 1, wherein said photode-
  It should read as: 2. The multimode FPA of claim 1, wherein said photode-

- Column 10, Claim 3, Line 58, The multimode EPA of Claim 2, wherein said first sub-
  It should read as: 3. The multimode FPA of claim 2, wherein said first sub-

- Column 10, Claim 4, Line 64, The multimode EPA of claim 1, further comprising a
  It should read as: 4. The multimode FPA of claim 1, further comprising a

- Column 10, Claim 4, Line 65, readout integrated circuit (ROTC) with an insulated contact
  It should read as: readout integrated circuit (ROIC) with an insulated contact

- Column 11, Claim 5, Line 1, The multimode EPA of claim 4, wherein said first bias
  It should read as: 5. The multimode FPA of claim 4, wherein said first bias

- Column 11, Claim 6, Line 4, The multimode EPA of claim 1, wherein photodetectors
  It should read as: 6. The multimode FPA of claim 1, wherein photodetectors

- Column 11, Claim 7, Line 7, The multimode EPA of claim 1, wherein photodectors
  It should read as: 7. The multimode FPA of claim 1, wherein photodetectors

- Column 11, Claim 8, Line 12, The multimode EPA of claim 1, wherein the first and
  It should read as: 8. The multimode FPA of claim 1, wherein the first and

- Column 11, Claim 9, Line 17, The multimode EPA of claim 8, further comprising:
  It should read as: 9. The multimode FPA of claim 8, further comprising:

- Column 11, Claim 10, Line 24, The multimode EPA of claim 1, wherein the first and
  It should read as: 10. The multimode FPA of claim 1, wherein the first and Signed and Sealed this Twenty-second Day of June, 2010

David J. Kappos
*Director of the United States Patent and Trademark Office*

CERTIFICATE OF CORRECTION (continued)
U.S. Pat. No. 7,608,823 B2

- Column 11, Claim 11, Line 27, The multimode EPA of claim 10, further comprising:
  It should read as: 11. The multimode FPA of claim 10, further comprising:

- Column 11, Claim 12, Line 38, The multimode EPA of claim 1, further comprising
  It should read as: 12. The multimode FPA of claim 1, further comprising

- Column 11, Claim 13, Line 42, The multimode EPA of claim 12, wherein the micro-
  It should read as: 13. The multimode FPA of claim 12, wherein the micro-

- Column 11, Claim 14, Line 44, The multimode EPA of claim 13, wherein the diffrac-
  It should read as: 14. The multimode FPA of claim 13, wherein the diffrac-

- Column 11, Claim 15, Line 47, A multimode focal plane array (EPA), comprising:
  It should read as: 15. A multimode focal plane array (FPA), comprising:

- Column 11, Claim 15, Line 57, a readout integrated circuit (ROTC) with an insulated con-
  It should read as: a readout integrated circuit (ROIC) with an insulated con-

- Column 11, Claim 16, Line 62, The multimode EPA of claim 15, wherein said photo-
  It should read as: 16. The multimode FPA of claim 15, wherein said photo-

- Column 11, Claim 16, Line 64, with CMOS design rules, said ROTC's insulated contact
  It should read as: with CMOS design rules, said ROIC's insulated contact

- Column 12, Claim 17, Line 1, The multimode EPA of claim 15, wherein the first and
  It should read as: 17. The multimode FPA of claim 15, wherein the first and

- Column 12, Claim 18, Line 7, a focal plane array (EPA) comprising first and second sub-
  It should read as: a focal plane array (FPA) comprising first and second sub-

- Column 12, Claim 18, Line 11, rays having grooves in the EPA, at least some of said
  It should read as: rays having grooves in the FPA, at least some of said

- Column 12, Claim 18, Line 18, an external lens behind the EPA that focuses active IR
  It should read as: an external lens behind the FPA that focuses active IR

- Column 12, Claim 18, Line 21, at a second wavelength onto the EPA;
  It should read as: at a second wavelength onto the FPA;

- Column 12, Claim 18, Line 25, a readout integrated circuit (ROTC) that permits applica-
  It should read as: a readout integrated circuit (ROIC) that permits applica-

- Column 12, Claim 20, Line 34, The multimode EPA of claim 19, wherein said first bias
  It should read as: 20. The multimode FPA of claim 19, wherein said first bias

CERTIFICATE OF CORRECTION (continued)
U.S. Pat. No. 7,608,823 B2

- Column 12, Claim 21, Line 37, A multimode focal plane array (EPA), comprising:
  It should read as: 21. A multimode focal plane array (FPA), comprising:

- Column 12, Claim 22, Line 51, The multimode EPA of claim 21, wherein the stack
  It should read as: 22. The multimode FPA of claim 21, wherein the stack

- Column 12, Claim 23, Line 53, The multimode EPA of claim 21, wherein the stack
  It should read as: 23. The multimode FPA of claim 21, wherein the stack

- Column 14, Claim 24, Line 1, a readout integrated circuit (ROTC) on the detector array,
  It should read as: a readout integrated circuit (ROIC) on the detector array,

- Column 14, Claim 24, Line 2, said ROTC including an insulated contact structure that
  It should read as: said ROIC including an insulated contact structure that